(12) United States Patent
Yoneda

(10) Patent No.: US 6,700,208 B1
(45) Date of Patent: Mar. 2, 2004

(54) SURFACE MOUNTING SUBSTRATE HAVING BONDING PADS IN STAGGERED ARRANGEMENT

(75) Inventor: Yoshihiro Yoneda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 19 days.

(21) Appl. No.: 09/691,327

(22) Filed: Oct. 18, 2000

(30) Foreign Application Priority Data

Oct. 28, 1999 (JP) .......................................... 11-307573

(51) Int. Cl.[7] .......................... H01L 23/48; H01L 23/52; H01L 29/40
(52) U.S. Cl. ........................ 257/779; 257/780; 257/781; 257/784; 257/786
(58) Field of Search ................................ 257/672, 673, 257/676, 733, 737, 775, 777, 786, 779, 784, 781, 780, 776

(56) References Cited

U.S. PATENT DOCUMENTS

| | | | | |
|---|---|---|---|---|
| 4,546,371 A | * | 10/1985 | Nieveen van Dijkum et al. | 257/365 |
| 5,019,002 A | * | 5/1991 | Holmberg | 445/24 |
| 5,197,887 A | * | 3/1993 | Davidge et al. | 439/60 |
| 5,468,681 A | * | 11/1995 | Pasch | 438/108 |
| 5,468,999 A | * | 11/1995 | Lin et al. | 257/784 |
| 5,489,804 A | * | 2/1996 | Pasch | 257/778 |
| 5,635,424 A | * | 6/1997 | Rostoker et al. | 438/612 |
| 5,734,559 A | * | 3/1998 | Banerjee et al. | 361/361 |
| 5,761,048 A | * | 6/1998 | Trabucco | 361/760 |
| 5,801,447 A | * | 9/1998 | Hirano et al. | 257/778 |
| 5,814,892 A | * | 9/1998 | Steidl et al. | 257/784 |
| 5,818,114 A | * | 10/1998 | Pendse et al. | 257/786 |
| 5,898,213 A | * | 4/1999 | Torres | 257/666 |
| 5,909,054 A | * | 6/1999 | Kozono | 257/667 |
| 5,956,232 A | * | 9/1999 | Zaket et al. | 361/760 |
| 6,040,235 A | * | 3/2000 | Badehi | 438/464 |
| 6,212,077 B1 | * | 4/2001 | Brown et al. | 361/777 |
| 6,218,696 B1 | * | 4/2001 | Radius | 257/302 |
| 6,451,626 B1 | * | 9/2002 | Lin | 438/108 |
| 6,452,807 B1 | * | 9/2002 | Barrett | 361/767 |

FOREIGN PATENT DOCUMENTS

| | | |
|---|---|---|
| JP | 04364051 | 12/1992 |
| JP | 10050764 | 2/1998 |
| JP | 11145328 | 5/1999 |

\* cited by examiner

Primary Examiner—Amir Zarabian
Assistant Examiner—Ida M. Soward
(74) Attorney, Agent, or Firm—Ladas & Parry

(57) ABSTRACT

A surface mounting substrate is configured to surface mount a semiconductor element thereon, the semiconductor element having a plurality of protruding electrodes arranged in a staggered arrangement of two rows. A plurality of bonding pads formed on a substrate are arranged in a staggered arrangement corresponding to the staggered arrangement of the protruding electrodes of the semiconductor element. Each of the bonding pads includes a pad portion having a substantially uniform width and an end portion extending from the pad portion toward the other row of the bonding pads. The end portion of each of the bonding pads lacks a portion extending beyond a boundary between the end portion and the pad portion of the bonding pads arranged in the other row. Accordingly, a reliable mounting can be achieved even if the protruding electrodes are offset from bonding pads.

8 Claims, 8 Drawing Sheets

BOUNDARY BETWEEN PAD PORTION AND END PORTION

BOUNDARY BETWEEN PAD PORTION AND END PORTION

SURFACE MOUNTING SUBSTRATE HAVING BONDING PADS IN STAGGERED ARRANGEMENT

BACKGROUND OF THE INVENTION

1. Field of the Invention

The present invention generally relates to a surface mounting structure and, more particularly, to a surface mounting substrate having a plurality of bonding pads arranged in a staggered arrangement.

In recent years, densification and miniaturization of semiconductor chips have rapidly advanced, and, thereby, the number of connection terminals provided on a semiconductor chip has been increased. Accordingly, a distance between adjacent connection terminals has been reduced. Since the number of connection terminals is increased, the connection terminals are arranged along two rows in a staggered relationship so as to make a distance between the adjacent connection terminals as large as possible.

In order to attempt miniaturization of electronic equipment in which a semiconductor chip is incorporated, a mounting area of a mounting substrate on which a semiconductor chip is mounted must be reduced. Thus, a semiconductor chip is flip-chip mounted to a mounting substrate by using protruding electrodes (bumps) as the connection terminals of the semiconductor chip. Additionally, in order to achieve a package allowing a large power consumption and high-frequency characteristic, a surface mounting method such as the flip-chip mounting method is indispensable.

Additionally, the arrangement of the connection terminals has been shifted from a single row peripheral arrangement to a double row peripheral arrangement and further to an area bump arrangement so as to increase the number of the connection terminals. However, the area bump arrangement requires changes in the chip manufacturing process performed by a chip manufacturer such that redistribution of bonding pads and formation of solder bumps must be made by the chip manufacturer. That is, in order to introduce the flip-chip mounting method according to the area bump arrangement, a large change is needed not only in the design of the semiconductor chip but also in the manufacturing facility. Accordingly, it is difficult to shift to the area bump arrangement in a short period of time.

On the other hand, since there is no large change in mounting processes between a semiconductor chip provided with connection terminals in the double row peripheral arrangement and a semiconductor chip provided with connection terminals provided in the single row peripheral arrangement, merely a design change may be sufficient to shift from the single row peripheral arrangement to the double row peripheral arrangement. Accordingly, use of semiconductor chips which adopts the double row peripheral arrangement increases so as to deal with the increase in the connection terminals of the recent semiconductor chips.

2. Description of the Related Art

FIG. 1 is a plan view of a semiconductor chip having protruding electrodes in the double row peripheral arrangement. The semiconductor chip 1 shown in FIG. 1 is configured and arranged to be mounted to a mounting substrate by a flip-chip mounting method. The protruding electrodes 2 are formed as stud bumps 2 made of gold. The gold bumps 2 are arranged in two rows in the surroundings of the mounting area of the semiconductor chip 1.

FIG. 2 is a plan view of a mounting substrate to which the semiconductor chip 1 shown in FIG. 1 is mounted. Bonding pads 4 are provided on a wiring surface of the mounting substrate 3 in positions corresponding to the arrangement of the gold bumps 2 of the semiconductor chip 1. A conductive wiring part 5 extends from each of the bonding pads 4 so that each of the bonding pads 4 is connected to a corresponding one of interlayer connection pads 6. In FIG. 2, the semiconductor chip 1 is to be mounted in an area indicated by single dashed chain lines, and the gold bumps 2 are to be soldered to the corresponding bonding pads 4.

Solder resist is applied to hatched areas in FIG. 2 so that solder is not applied to the hatched areas when the solder is applied to the bonding pads 4. Each of the bonding pads 4 and a part of each of the conductive wiring parts 5 are located in the area where the solder resist is not applied so as to be provided with the solder during the solder applying process.

Japanese Laid-Open Patent Application No. 11-145328 discloses a technique to bond bumps formed on a semiconductor chip to pad portions of conductive wiring members by an electrically conductive adhesive. The bumps of the semiconductor chip are arranged in a staggered arrangement of two rows, and the pad portions of the substrate are also arranged in a staggered arrangement of two rows. A conductive wiring part having a width smaller than the width of the pad extends from an end of each of the pad portions arranged on one of the two rows and protrudes into an area between adjacent two pad portions arranged on the other one of the two rows.

The semiconductor chip having the protruding bumps in the double row peripheral arrangement is originally designed to be mounted to a mounting substrate by a wire bonding method. Accordingly, a distance between the two rows of the protruding electrodes is as small as 100 $\mu$m to 150 $\mu$m. Thus, when the thus-designed semiconductor chip is mounted on a substrate by a flip-chip mounting method, each of the protruding electrodes of the semiconductor chip must be bonded to an extreme end of the corresponding one of the pad portions.

FIG. 3 is an enlarged plan view of a portion of the mounting substrate 3 shown in FIG. 2 which portion includes the bonding pads 4. In FIG. 3, areas indicated by dotted lines are areas where the gold bumps 2 of the semiconductor chip 1 are bonded. The conductive wiring patterns are formed by etching a copper plate on the mounting substrate 3. According to the recent technique, a distance between adjacent ones of the conductive wiring patterns is required to be at least about 40 $\mu$m. Additionally, a diameter of each of the gold bumps is 80 $\mu$m. Accordingly, if the distance between the two rows along which the bonding pads are arranged is set to a minimum value which is about 40 $\mu$m, a portion of each of the gold bumps protrudes from the corresponding one of the bonding pads 4. Thus, in a case in which the gold bumps 2 are offset in the longitudinal direction of the bonding pads 4 due to a positioning error, a large portion of each of the gold bumps 2 is out of the corresponding one of the bonding pads 4.

Additionally, if each of the bonding pads 4 has an elongated rectangular shape as shown in FIG. 3, the gold bumps 2 may not be sufficiently bonded to the bonding pads 4. A description will now be given, with reference to FIGS. 4A and 4B, of a case in which an incomplete bonding occurs. FIG. 4A is a cross-sectional view showing a state in which the gold bump 2 is located at an accurate position relative to the bonding pad 4. FIG. 4B is a cross-sectional view showing a state in which the gold bump 2 is offset from the accurate position on the bonding pad 4. It should be noted that each of FIGS. 4A and 4B corresponds to a cross-sectional view taken along a line IV—IV of FIG. 3.

When the semiconductor chip 1 is mounted to the mounting substrate 3 by a flip-chip bonding method, a solder 7 is previously applied to each of the bonding pads 4. The solder 7 on each of the bonding pads 4 has a maximum thickness in the middle thereof and the thickness is reduced toward each end of each of the bonding pads 4. Such a shape of the solder 7 is caused by the surface tension of the melted solder 7. Accordingly, the solder 7 on each of the bonding pads 4 solidifies in the thus-formed state.

When the gold bump 2 is located at a normal position as shown in FIG. 4A, the gold bump 2 is bonded at a position where the solder 7 is relatively thick. Thus, the gold bump 2 is normally soldered to the bonding pad 4 by a sufficient amount of solder. On the other hand, when the gold bump 3 is offset from the normal position in the longitudinal direction of the bonding pad 4 as shown in FIG. 4B, the gold bump 2 is located at a position where the solder 7 on the bonding pad 4 is relatively thin. Accordingly, in the case shown in FIG. 4B, the reliability of soldering is lowered since incomplete soldering may occur due to insufficient amount of solder. A resin 8 is provided so as to reinforce the connection between the semiconductor chip 1 and the bonding substrate 3.

Additionally, in the structure of the conductive wiring including the bonding pads disclosed in the above-mentioned Japanese Laid-Open Patent Application No. 11-145328, the thickness of the solder at the end of the bonding pad can maintained relatively thick as compared to a case in which the conductive wiring is not provided since the conductive wiring extends from the extreme end of the bonding pad. However, since the conductive wiring of one the bonding pads arranged in one of the two rows extends between adjacent ones of the bonding pads arranged in the other one of the two rows, the distance between the adjacent bonding pads must be large. Accordingly, there is a problem in that the arrangement of the bonding pads that can satisfy an electrode pitch (approximately 100 µm) required by the recent semiconductor chip manufacturing technique cannot be achieved.

SUMMARY OF THE INVENTION

It is a general object of the present invention to provide an improved and useful surface mounting structure in which the above-mentioned problems are eliminated.

A more specific object of the present invention is to provide a surface mounting substrate that can provide a reliable mounting when a semiconductor chip having protruding electrodes arranged in a double row peripheral arrangement is mounted to a mounting substrate even if the protruding electrodes are offset from bonding pads formed on the mounting substrate.

In order to achieve the above-mentioned objects, there is provided according to the present invention a surface mounting substrate configured and arranged to surface mount a semiconductor element thereon, the semiconductor element having a plurality of protruding electrodes arranged in a staggered arrangement of two rows, the surface mounting substrate comprising a substrate; and a plurality of bonding pads formed on the substrate, the bonding pads being arranged in a staggered arrangement corresponding to the staggered arrangement of the protruding electrodes of the semiconductor element, wherein each of the bonding pads comprises a pad portion having a substantially uniform width and an end portion extending from the pad portion toward the other row of the bonding pads, and the end portion of each of the bonding pads lacks a portion extending beyond a boundary between the end portion and the pad portion of the bonding pads arranged in the other row.

According to the present invention, the connected portion of each of the protruding electrodes to the respective one of the bonding pads can be apart away from the tip of each of the bonding pads. Accordingly, a large part of each of the protruding electrodes does not protrude from the respective one of the bonding pads even when there is a positional offset of the protruding electrodes relative to the bonding pads. Thus, the protruding electrodes of the semiconductor element can be reliably bonded to the respective bonding pads of the surface mounting substrate.

In the surface mounting substrate according to the present invention, the end portion of each of the bonding pads may protrude into an area between the end portions of adjacent bonding pads arranged in the other row. Accordingly, the distance between the connected part of each of the protruding electrodes and the tip of the respective one of the bonding pads can be increased.

In one embodiment of the present invention, the end portion of each of the bonding pads may be formed in a triangular shape. Additionally, the protruding electrodes may be formed as stud bumps, and the stud bumps may be bonded to the respective bonding pads by a solder previously applied to the bonding pads.

Additionally, there is provided according to another aspect of the present invention a surface mounting structure comprising: a semiconductor element having a plurality of protruding electrodes arranged in a staggered arrangement of two rows; and a surface mounting substrate having a plurality of bonding pads formed on a substrate, the bonding pads being arranged in a staggered arrangement corresponding to the staggered arrangement of the protruding electrodes of the semiconductor element, wherein each of the bonding pads comprises a pad portion having a substantially uniform width and an end portion extending from the pad portion toward the other row of the bonding pads; the end portion of each of the bonding pads lacks a portion extending beyond a boundary between the end portion and the pad portion of the bonding pads arranged in the other row; and the protruding electrodes are bonded to the respective bonding pads by a solder previously applied to the bonding pads.

According to the above-mentioned invention, the connected portion of each of the protruding electrodes to the respective one of the bonding pads can be apart away from the tip of each of the bonding pads. Accordingly, a large part of each of the protruding electrodes does not protrude from the respective one of the bonding pads even when there is a positional offset of the protruding electrodes relative to the bonding pads. Thus, the protruding electrodes of the semiconductor element can be reliably bonded to the respective bonding pads of the surface mounting substrate.

Other objects, features and advantages of the present invention will become more apparent from the detailed description when read in conjunction with the accompanying drawings.

DETAILED DESCRIPTION OF THE PREFERRED EMBODIMENTS

Figure 5:
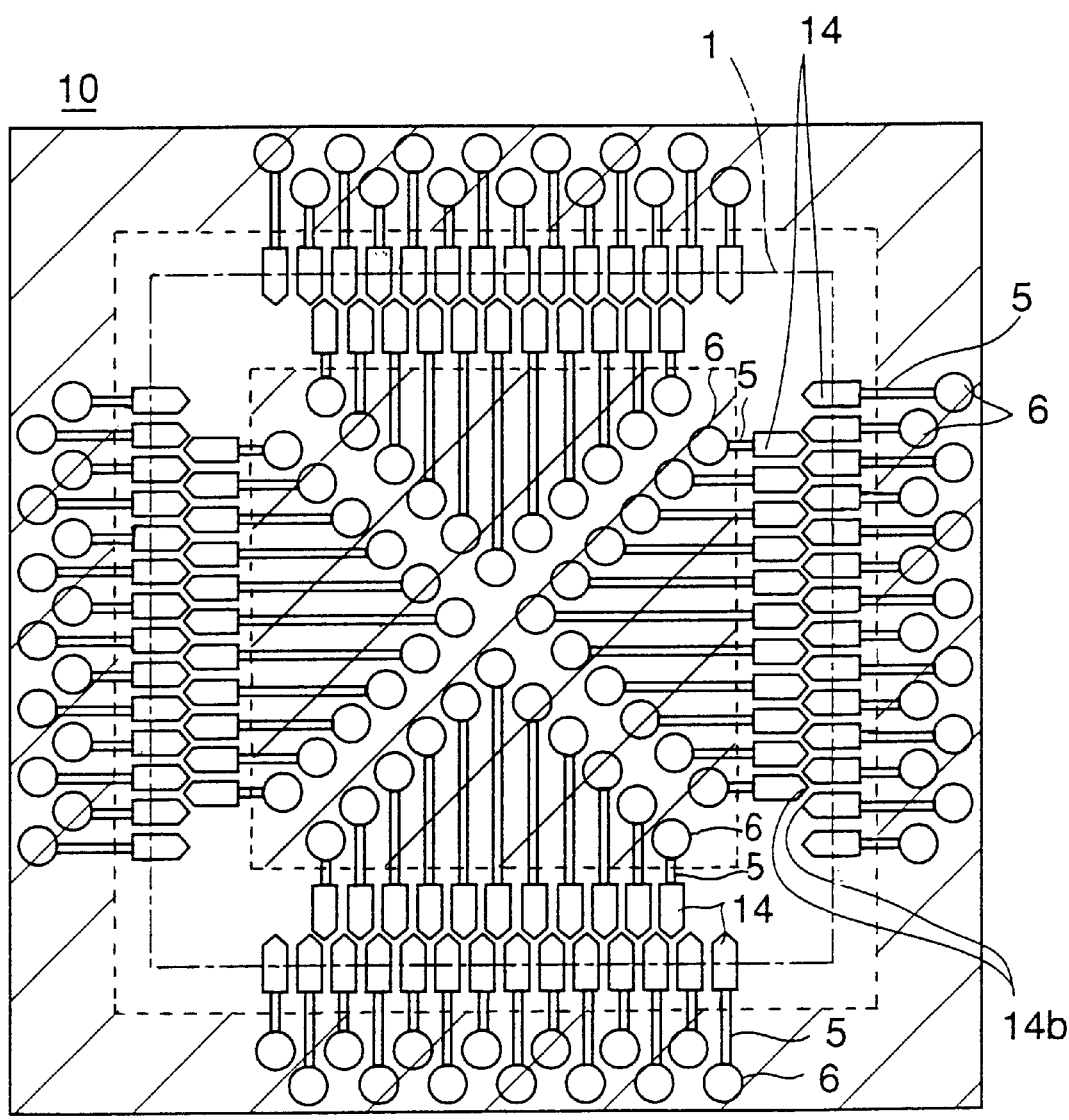
FIG. 5 is a plan view of a mounting substrate according to the present invention.

A description will now be given, with reference to FIG. 5, of a conceptual structure of the present invention. FIG. 5 is a plan view of a mounting substrate according to the present invention. In FIG. 5, parts that are the same as the parts shown in FIG. 2 are given the same reference numerals, and descriptions thereof will be omitted.

Figure 1:
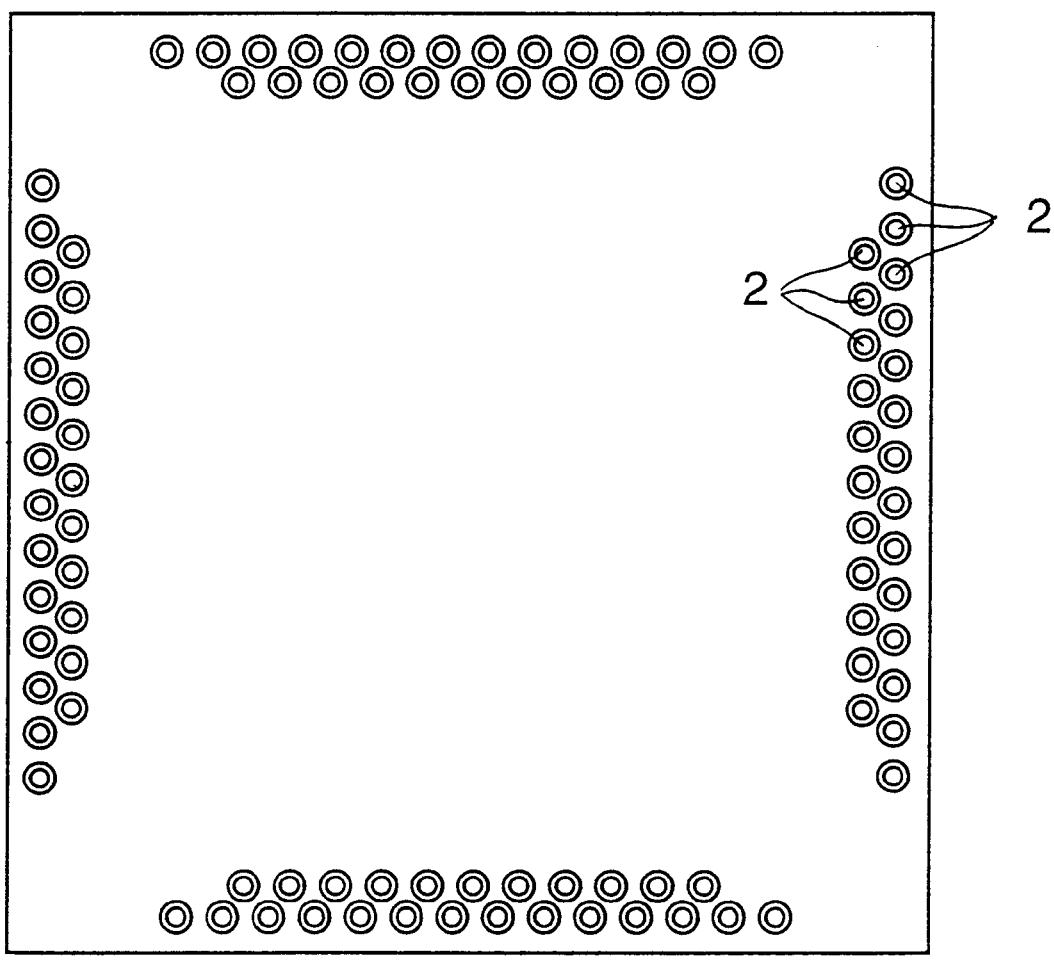
FIG. 1 is a plan view of a semiconductor chip having protruding electrodes in a double row peripheral arrangement.
Figure 2:
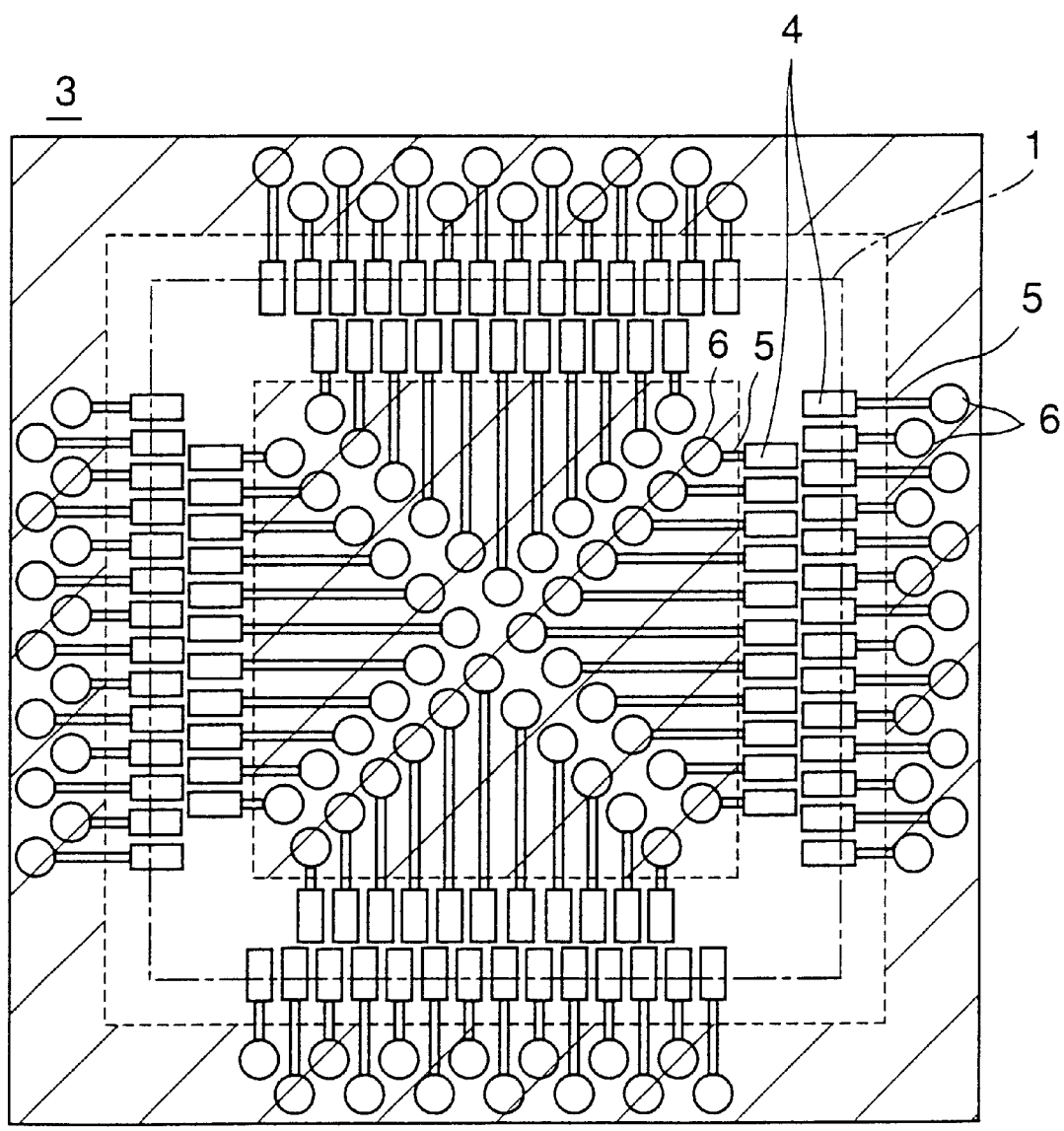
FIG. 2 is a plan view of a mounting substrate to which the semiconductor chip shown in FIG. 1 is mounted.
Figure 3:
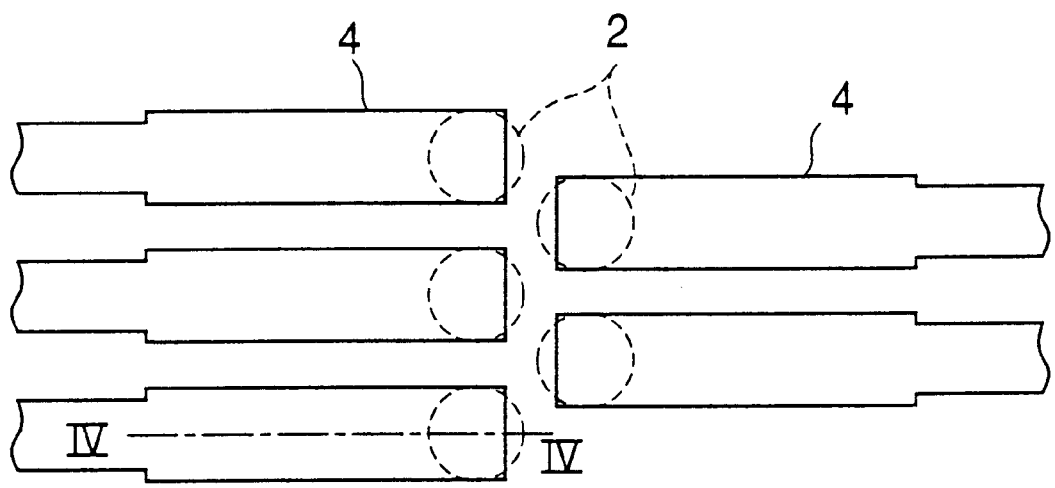
FIG. 3 is an enlarged plan view of a portion of a mounting substrate shown in FIG. 2.
Figure 4A:
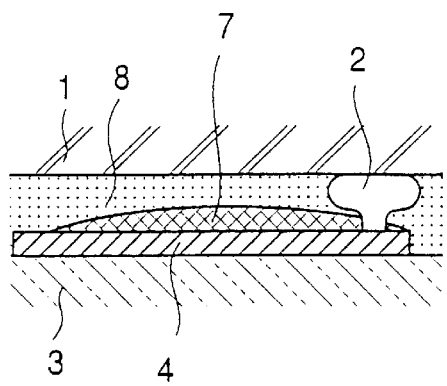
FIG. 4A is a cross-sectional view taken along a line IV—IV of FIG. 3 in a state in which a gold bump is located at an accurate position relative to a bonding pad.
Figure 4B:
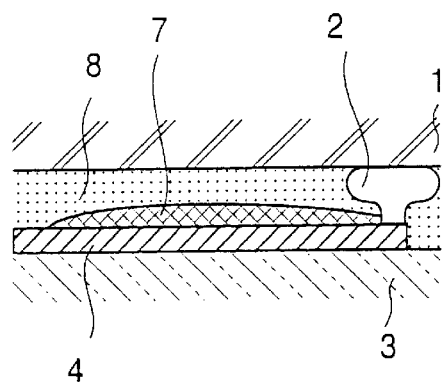
FIG. 4B is a cross-sectional view taken along the line IV—IV of FIG. 3 in a state in which the gold bump is offset from an accurate position on the bonding pad.

Unlike the bonding pads 4 provided in the conventional mounting substrate 3 shown in FIG. 2, the mounting substrate 10 according to the present invention has a plurality of bonding pads 14 each of which has a triangle-shaped end portion 14b as shown in FIG. 5. That is, the edge of each of the bonding pads 4 shown in FIG. 2 is parallel to a line along which the bonding pads 4 are arranged, whereas the width of the end portion 14b of each of the bonding pads 14 provided in the mounting substrate 10 according to the present invention is gradually reduced toward the tip of the end portion 14b. Accordingly, the end portion 14b of each of the bonding pads 14 arranged in one of the two rows can be extended toward the other one of the two rows of the bonding pads 14.

The bonding pads 14 are arranged in the double row peripheral arrangement in response to the arrangement of the gold bumps 2 of the semiconductor chip 1 to be mounted on the mounting substrate 10. Since the end portion 14b of each of the bonding pads 14 is formed in a triangular shape, the end portion 14b of the bonding pads 14 arranged along one of the two rows does not overlap the end portion 14b of the bonding pads 14 arranged along the other of the two rows. By providing the end portion 14b of each of the bonding pads 14, a large portion of the gold bumps 2 do not positioned out of the corresponding bonding pads 14 even when the gold bumps 2 of the semiconductor chip 1 are offset from the normal positions on the bonding pads 14 in the longitudinal direction of the bonding pads 14. Additionally, when the gold bumps 2 are soldered to the bonding pads 14, the gold bumps 2 are not positioned on the extreme end of the bonding pads 14 at which the solder applied on the bonding pads 14 is thin. Thereby, a reliable soldering can be achieved.

It should be noted that a printed circuit board or a ceramic substrate can be used as the mounting substrate 10 according to the present embodiment.

Additionally, a solder resist is applied to hatched areas in FIG. 5 so that solder is not applied to the hatched areas when the solder is applied to the bonding pads 14. The solder resist serves as a mask to prevent the solder from being applied to an area where the solder resist does not present. Accordingly, each of the bonding pads 14 and a part of each of the conductive wiring parts 5 are located in the area (solder resist opening) where the solder resist is not applied so as to be provided with the solder during the solder applying process.

Figure 6:
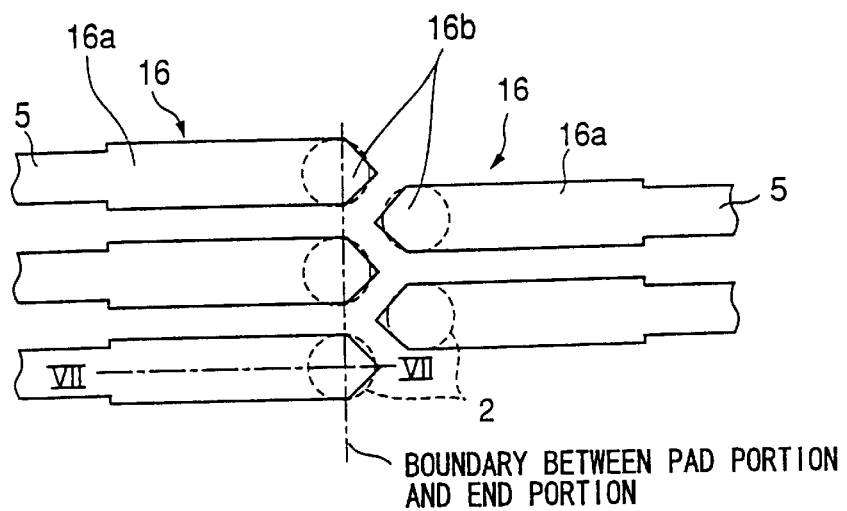
FIG. 6 is a plan view of bonding pads according to a first embodiment of the present invention.

A description will now be given, with reference to FIGS. 6, 7A and 7B, of bonding pads according to a first embodiment of the present invention. FIG. 6 is a plan view of the bonding pads according to the first embodiment of the present invention.

Each of the bonding pads 16 shown in FIG. 6 has a pad portion having a uniform width and an end portion 16b having a triangular shape and extending from the pad portion 16a. The pad portion 16a is a portion to which a solder is applied when the gold bumps 2 of the semiconductor chip 1 is flip-chip mounted to the mounting substrate. The pad portion 16a has a uniform width over the entire length so that a sufficient amount of solder can be applied to the bonding pad 16. Additionally, the bonding pads 16 are formed to have the same width and length so that the same amount of solder can be supplied to each of the bonding pads 16.

It should be noted that although the pad portion 16a is formed to have a uniform width, the width may slightly fluctuate due to fluctuation in the manufacturing process or formation by an etching method. However, such a slight fluctuation in the width of the pad portion should be considered as a substantially uniform width.

The end portion 16b is formed on the side facing the bonding pads 16 arranged along the next rows. The width of the end portion 16b is reduced toward the tip of the end portion 16b. Each of the gold bumps 2 is positioned over the pad portions 16a and the end portions 16b of the respective bonding pads 16.

The bonding pads 16 according to the present embodiment are arranged as shown in FIG. 6. The bonding pads 16 are formed by patterning a copper plate by an etching method. Accordingly, a distance between the adjacent bonding pads 16 is set to a distance (currently about 40 μm), which can be achieved by an etching method. Additionally, a distance between the end portions 16b, which are opposite to each other, must be a distance achieved by the etching method.

In the present embodiment, the end portion 16b of one of the bonding pads 16 arranged in one of the two rows does not protrude into an area between the adjacent end portions 16b of the bonding pads 16 arranged in the other of the two rows.

Figure 7A:
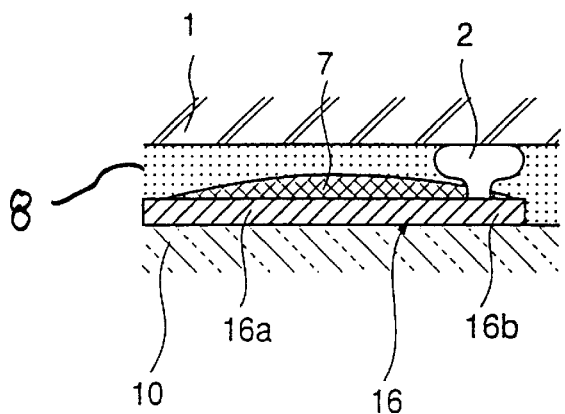
FIG. 7A is a cross-sectional view taken along a line VII—VII of FIG. 6 in a state in which a gold bump is located at an accurate position relative to the bonding pad.

FIG. 7A is a cross-sectional view showing a state in which the gold bump 2 is located at an accurate position relative to the bonding pad 16. FIG. 7B is a cross-sectional view showing a state in which the gold bump 2 is offset from the accurate position on the bonding pad 16. It should be noted that each of FIGS. 7A and 7B corresponds to a cross-sectional view taken along a line VII—VII of FIG. 6.

When there is no positional offset of the gold bump 2, the gold bump 2 is sufficiently distant from the tip of the end portion 16b of the corresponding bonding pad 16 as shown in FIG. 7A. Accordingly, the entire gold bump 2 is positioned on the bonding pad 16. Thus, the gold bump 2 is soldered at a position where the solder 7 has a sufficient thickness, thereby achieving a reliable mounting.

Figure 7B:
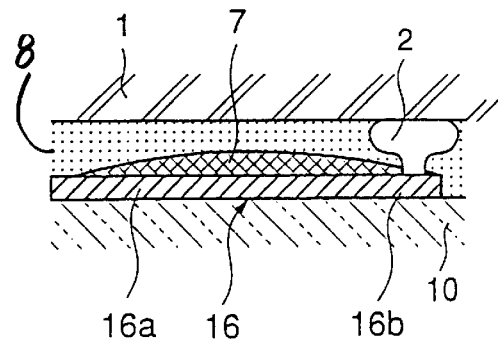
FIG. 7B is a cross-sectional view taken along the line VII—VII of FIG. 6 in a state in which the gold bump is offset from an accurate position on the bonding pad.

When the gold bump 2 is offset toward the tip of the bonding pad 16 as shown in FIG. 7B, the gold bump 2 does not protrude from the bonding pad 16 since the end portion 16b extends from the pad portion 16a. Accordingly, the gold bump 2 is maintained at a position where the solder 7 has a sufficient thickness. Thus, a reliable mounting can be achieved even if the gold bump 2 is offset from an accurate position.

It should be noted that a resin 8 is filled between the semiconductor chip 1 and the mounting substrate 10 after the semiconductor chip 1 is mounted to the mounting substrate 10. Then, the resin 8 is cured so as to securely fix the semiconductor chip 1 to the mounting substrate 10.

Figure 8:
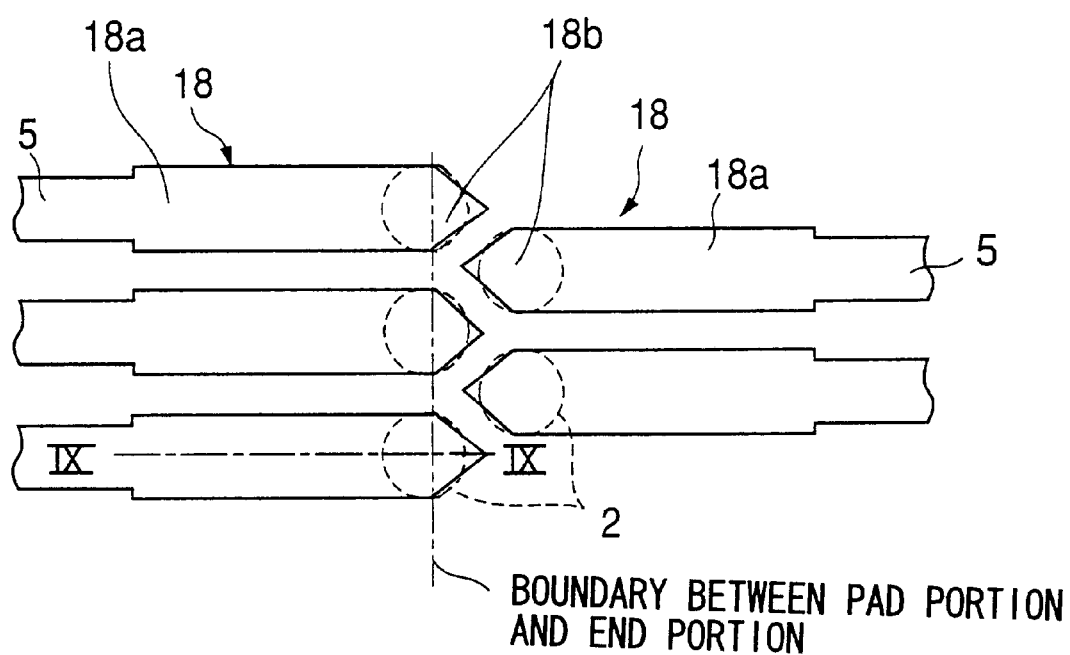
FIG. 8 is a plan view of bonding pads according to a second embodiment of the present invention.

A description will now be given, with reference to FIGS. 8, 9A and 9B, of bonding pads according to a second embodiment of the present invention. FIG. 8 is a plan view of the bonding pads according to the second embodiment of the present invention.

Similar to the bonding pad 16 shown in FIG. 6, each of the bonding pads 18 shown in FIG. 8 includes a pad portion 18a having a uniform width and an end portion 18b having a triangular shape and extending from the pad portion 18a. The difference between the bonding pad 18 according to the present embodiment and the bonding pad 16 shown in FIG. 6 is that the end portion 18b of the bonding pad 18 has a top angle smaller than that of the end portion 16b of the bonding pad 16 so that the end portion 18b of the bonding pad 18 arranged in one of the two rows protrudes into an area between the adjacent end portions 18b of the bonding pads 18 arranged in the other of the two rows.

Although the end portion 18b of the bonding pad 18 arranged in one of the two rows protrudes into an area between the adjacent end portions 18b of the bonding pads 18 arranged in the other of the two rows, the end portion 18b does not protrude into an area between the adjacent pad portions 18a. This is because if the end portion 18b protrudes into the area between the adjacent pad portions 18a of the other row, a space between the adjacent bonding pads 18 is substantially reduced which may cause a problem in that the bonding pads 18 cannot be formed by an etching method. One way to solve the problem is to increase the distance between the adjacent bonding pads 18. However, an increase in the pitch of the bonding pads 18 results in an increase in the pitch of the gold bumps 2 of the semiconductor chip 1. Such an increase in the pitch of the gold bumps goes against the attempt to deal with the arrangement of protruding electrode with a narrow pitch.

Accordingly, in the present embodiment, the end portion 18b of each of the bonding pads 18 does not extend beyond the boundary between the end portion 18b and the pad portion 18a of the bonding pad 18 arranged in the other row. That is, the end portion 18 of each of the bonding pads 18 lacks a portion protruding into an area between the adjacent pad portions 18a of the bonding pads 18 arranged in the other row.

Figure 9A:
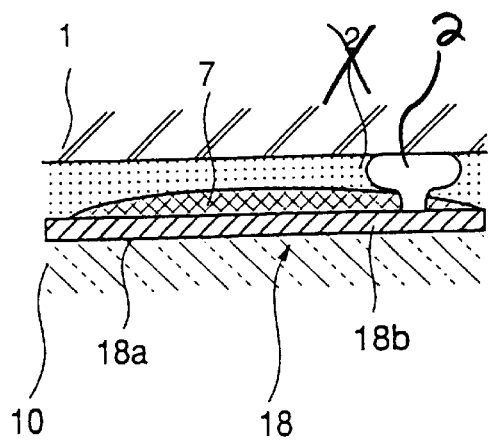
FIG. 9A is a cross-sectional view taken along a line IX—IX of FIG. 8 in a state in which a gold bump is located at an accurate position relative to the bonding pad.

FIG. 9A is a cross-sectional view showing a state in which the gold bump 2 is located at an accurate position relative to the bonding pad 18. FIG. 9B is a cross-sectional view showing a state in which the gold bump 2 is offset from the accurate position on the bonding pad 18. It should be noted that each of FIGS. 9A and 9B corresponds to a cross-sectional view taken along a line IX—IX of FIG. 8.

When there is no positional offset of the gold bump 2, the gold bump 2 is sufficiently distant from the tip of the end portion 18b of the corresponding bonding pad 18 as shown in FIG. 9A. Accordingly, the entire gold bump 2 is positioned on the bonding pad 18. Thus, the gold bump 2 is soldered at a position where the solder 7 has a sufficient thickness, thereby achieving a reliable mounting.

Figure 9B:
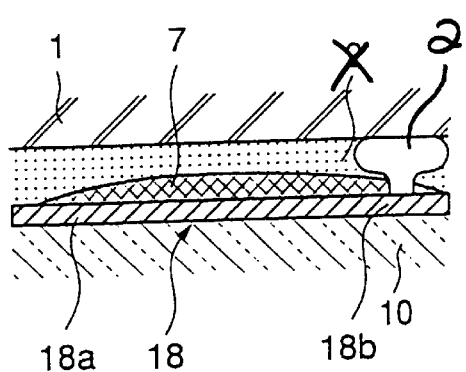
FIG. 9B is a cross-sectional view taken along the line IX—IX of FIG. 8 in a state in which the gold bump is offset from an accurate position on the bonding pad.

When the gold bump 2 is offset toward the tip of the bonding pad 18 as shown in FIG. 9B, the gold bump 2 does not protrude from the bonding pad 18 since the end portion 18b extends from the pad portion 18a. Accordingly, the gold bump 2 is maintained at a position where the solder 7 has a sufficient thickness. Thus, a reliable mounting can be achieved even if the gold bump 2 is offset from an accurate position.

In the present embodiment, the tip of the end portion 18b extends toward the other row of the bonding pads 18 further than the end portion 16b of the bonding pad 16 according to the first embodiment. Thus, a reliable mounting can be achieved even if there is a large offset of the gold bumps 2.

It should be noted that although the end portion of the bonding pad is configured to be a triangular shape in the above-mentioned embodiments, the shape of the end portion is not limited to the triangular shape. That is, the advantages of the above-mentioned embodiments may be obtained by making the end portion having a width smaller than the pad portion so that the end portion does not overlap another end portion of the bonding pad arranged in the other row.

The present invention is not limited to the specifically disclosed embodiments, and variations and modifications may be made without departing from the scope of the present invention.

The present application is based on Japanese priority patent application No. 11-307573 filed on Oct. 28, 1999, the entire contents of which are hereby incorporated by reference.

What is claimed is:

1. A surface mounting substrate configured and arranged to surface mount a semiconductor element thereon, the semiconductor element having a plurality of protruding electrodes arranged in a staggered arrangement of two rows, the surface mounting substrate comprising:

a substrate; and
   a plurality of bonding pads formed on the substrate arrangement the protruding electrodes of the semiconductor element,
   wherein each of the bonding pads comprises a pad portion having a substantially uniform width and an end portion extending from the pad portion toward the other row of the bonding pads, wherein a width of the end portion is smaller than the width of the pad portion, and the end portions of a plurality of the pad portions protrude at least partially between the end portions of the other row of bonding pads, and the end portion of each of the bonding pads lacks a portion extending beyond a boundary between the end portion and the pad portion of the bonding pads arranged in the other row.

2. The surface mounting substrate as claimed in claim 1, wherein the end portion of each of the bonding pads protrudes into an area between the end portions of adjacent bonding pads arranged in the other row.

3. The surface mounting substrate as claimed in claim 1, wherein the end portion of each of the bonding pads is formed in a triangular shape.

4. The surface mounting substrate as claimed in claim 1, wherein the protruding electrodes are formed as stud bumps, and the stud bumps are bonded to the respective bonding pads by a solder previously applied to the bonding pads.

5. A surface mounting structure comprising:

a semiconductor element having a plurality of protruding electrodes arranged in a staggered arrangement of two rows; and a surface mounting substrate having a plurality of bonding pads formed on a substrate, the bonding pads being arranged in a staggered arrangement corresponding to the staggered arrangement of the protruding electrodes of the semiconductor element, wherein each of the bonding pads comprises a pad portion having a substantially uniform width and a end portion extending from the pad portion toward the other row of the bonding pads, wherein a width of the end portion is smaller than the width of the pad portion;

the end portion of each of the bonding pads lacks a portion extending beyond a boundary between the end portion and the pad portion of the bonding pads arranged in the other row; and the protruding electrodes are bonded to the respective bonding pads by a solder previously applied to the bonding pads.

6. The surface mounting structure as claimed in claimed 5, wherein the end portion of each of the bonding pads protrudes into an area between the end portions of adjacent bonding pads arranged in the other row.

7. The surface mounting structure as claimed in claim 5, wherein the end portion of each of the bonding pads is formed in a triangular shape.

8. The surface mounting structure as claimed in claim 5, wherein the protruding electrodes are formed as stud bumps.

* * * * *